United States Patent
Chang et al.

(10) Patent No.: US 10,559,651 B2
(45) Date of Patent: Feb. 11, 2020

(54) METHOD OF FORMING MEMORY CAPACITOR

(71) Applicants: UNITED MICROELECTRONICS CORP., Hsin-Chu (TW); Fujian Jinhua Integrated Circuit Co., Ltd., Quanzhou, Fujian Province (CN)

(72) Inventors: Feng-Yi Chang, Tainan (TW); Fu-Che Lee, Taichung (TW); Chieh-Te Chen, Kaohsiung (TW)

(73) Assignees: UNITED MICROELECTRONICS CORP., Hsin-Chu (TW); Fujian Jinhua Integrated Circuit Co., Ltd., Quanzhou, Fujian Province (CN)

( * ) Notice: Subject to any disclaimer, the term of this patent is extended or adjusted under 35 U.S.C. 154(b) by 0 days.

(21) Appl. No.: 16/114,217

(22) Filed: Aug. 28, 2018

(65) Prior Publication Data

US 2019/0081134 A1    Mar. 14, 2019

(30) Foreign Application Priority Data

Sep. 14, 2017 (CN) .......................... 2017 1 0826528

(51) Int. Cl.

| | | |
|---|---|---|
| *H01L 21/3213* | (2006.01) | |
| *H01L 27/08* | (2006.01) | |
| *H01L 49/02* | (2006.01) | |
| *H01L 27/108* | (2006.01) | |

(52) U.S. Cl.
CPC ........ *H01L 28/92* (2013.01); *H01L 21/32133* (2013.01); *H01L 21/32139* (2013.01); *H01L 27/0805* (2013.01); *H01L 27/10852* (2013.01)

(58) Field of Classification Search
CPC ............... H01L 27/10814; H01L 28/92; H01L 21/32135; H01L 21/32139; H01L 27/10852; H01L 27/0805; H01L 21/32134; H01L 28/55; H01L 21/32133
See application file for complete search history.

(56) References Cited

U.S. PATENT DOCUMENTS

| | | |
|---|---|---|
| 4,675,073 A | 6/1987 | Douglas |
| 4,980,020 A | 12/1990 | Douglas |
| 5,122,225 A | 6/1992 | Douglas |
| 5,292,677 A | 3/1994 | Dennison |
| 7,199,005 B2 * | 4/2007 | Sandhu ............. H01L 27/10852 257/E21.019 |

(Continued)

*Primary Examiner* — Savitri Mulpuri
(74) *Attorney, Agent, or Firm* — Winston Hsu (57) ABSTRACT

The present invention relates to a method of forming a memory capacitor. A substrate is provided with a plurality of storage node contacts. A patterned supporting structure is formed on the substrate, following by forming a bottom electrode conformally on surface of plural openings in the patterned supporting structure, thereby contacting the storage node contacts. A sacrificial layer is formed in the opening. A soft etching process is performed to remove the bottom electrode on top and partial sidewall of the patterned supporting structure, wherein the soft etching process includes using a fluoride containing compound, a nitrogen and hydrogen containing compound and an oxygen containing compound. The sacrificial layer is completely removed away. A capacitor dielectric layer and a top electrode are formed on the bottom electrode layer.

9 Claims, 5 Drawing Sheets (56) References Cited

U.S. PATENT DOCUMENTS

| | | | |
|---|---|---|---|
| 7,271,051 B2* | 9/2007 | Manning | H01L 27/10817 |
| | | | 257/E21.013 |
| 7,271,055 B2 | 9/2007 | Lee | |
| 7,445,990 B2* | 11/2008 | Busch | D01F 1/04 |
| | | | 257/E27.087 |
| 7,517,753 B2* | 4/2009 | Manning | H01L 28/91 |
| | | | 257/E21.008 |
| 7,585,723 B2* | 9/2009 | Han | H01L 21/31116 |
| | | | 257/E21.647 |
| 7,709,342 B2* | 5/2010 | Kim | H01L 28/91 |
| | | | 257/E21.021 |
| 7,713,813 B2* | 5/2010 | Raghu | H01L 21/30604 |
| | | | 438/243 |
| 7,741,174 B2 | 6/2010 | Cho | |
| 8,927,384 B2* | 1/2015 | Kim | H01L 21/31144 |
| | | | 257/E21.021 |
| 9,224,794 B2 | 12/2015 | Keating | |
| 9,240,441 B2* | 1/2016 | Yoon | H01L 28/40 |
| 9,362,422 B2 | 6/2016 | Lim | |
| 10,147,726 B1* | 12/2018 | Chang | H01L 27/10814 |
| 10,186,513 B2* | 1/2019 | Chang | H01L 27/10885 |
| 10,373,957 B2* | 8/2019 | Chang | H01L 21/0217 |
| 10,381,239 B2* | 8/2019 | Chang | H01L 28/40 |
| 2004/0171212 A1 | 9/2004 | Won | |
| 2006/0086952 A1 | 4/2006 | Kim | |
| 2006/0086956 A1 | 4/2006 | Furukawa | |
| 2009/0206448 A1* | 8/2009 | Cho | H01L 28/91 |
| | | | 257/532 |
| 2012/0225554 A1* | 9/2012 | Yoon | H01L 21/76802 |
| | | | 438/675 |
| 2015/0214068 A1* | 7/2015 | Chen | H01L 21/31144 |
| | | | 438/703 |
| 2018/0226410 A1* | 8/2018 | Chang | H01L 27/10814 |
| 2018/0337184 A1* | 11/2018 | Chang | H01L 27/10814 |
| 2019/0043865 A1* | 2/2019 | Chang | H01L 27/10855 |

* cited by examiner

METHOD OF FORMING MEMORY CAPACITOR

BACKGROUND OF THE INVENTION

1. Field of the Invention

The present invention relates to a method of forming a memory capacitor, and more particularly, to a method of forming a memory capacitor containing a soft etching process.

2. Description of the Prior Art

A dynamic random access memory (DRAM) device is constituted by many memory cells. Generally, the memory cell is a semiconductor memory device with an access transistor and a storage capacitor. Each memory cell can store one bit data by storing electric charges in the storage capacitor.

In general, the storage capacitor is constituted by an upper electrode, a dielectric layer, and a lower electrode. The storage capability of the storage capacitor is proportion to an overlapping area between the upper/lower electrodes and the dielectric layer. Since modern electrical products are developed with minimized sizes thereof, the area of each memory cell tends to be reduced, so that the DRAM device can be designed with high integrated density. However, the reduction of the area of each memory cell leads to lower storage capability of the memory cell, which causes high refresh frequency and therefore affects the performance of the DRAM device. Currently, two methods are provided to increase storage capability of the storage capacitor. A method is proposed to use a material with higher dielectric constant for the dielectric layer, and the other method is proposed to increase the overlapping area between the upper/lower electrodes and the dielectric layer.

Several methods of increasing the area of the capacitor electrode have been proposed in the prior art. For example, crown-type stacked capacitors can be used to increase the total surface area of the capacitor electrode owing to its sidewall structures. However, because of the complexity of the fabrication process of forming the capacitor, when using conventional photolithography to form said crown-type stacked capacitors, it is usually limited to obtain a sidewall structure with desired depth and configuration in the crown-type stacked capacitors. The situation has limited the storage capacitances and the access speed in the memory device, becoming a problem that needs to be solved in current memory industry.

SUMMARY OF THE INVENTION

The present invention therefore provides a method of forming memory capacitor, which is able to increase the reliability of the crown-type electrode.

According to one embodiment, the present invention provides to a method of forming a memory capacitor. A substrate is provided with a plurality of storage node contacts. A patterned supporting structure is formed on the substrate, following by forming a bottom electrode layer conformally on surface of plural openings in the patterned supporting structure, so the bottom electrode layer can contact the storage node contacts. A sacrificial layer is formed on the bottom electrode layer and filled into the openings. A soft etching process is performed for removing the bottom electrode on the patterned supporting layer and partials of sidewalls of the openings, wherein said soft etching process comprises using a fluoride containing compound, a nitrogen and hydrogen containing compound and an oxygen containing compound. Next, the sacrificial layer is completely removed, following by removing partials of the patterned supporting layer. After forming a capacitor dielectric layer on the bottom electrode layer, a top electrode layer is formed on the capacitor dielectric layer.

According to another embodiment, the present invention provides a method of forming a memory capacitor. A substrate is provides, which comprises a plurality of storage node contacts. A patterned supporting structure is formed on the substrate, wherein the patterned supporting structure comprises a plurality of openings, each of which corresponding to each of storage node contacts. A bottom electrode layer is formed on the patterned supporting layer, wherein the bottom electrode layer is conformally formed on the patterned supporting layer and sidewalls and bottom surfaces of the openings, and contacting the storage node contacts. A sacrificial layer is formed on the bottom electrode layer, wherein the sacrificial layer is filled into the openings. A soft etching process is performed for removing the bottom electrode layer on the patterned supporting layer and partials of sidewalls of the openings, thereby making a lower surface of the bottom electrode layer lower than a top surface of the sacrificial layer and thereby forming a plurality of recesses between the patterned support layer, the sacrificial layer and the bottom electrode layer. Next, the sacrificial layer is completely removed, following by removing partials of the patterned supporting layer. After forming a capacitor dielectric layer on the bottom electrode layer, a top electrode layer is formed on the capacitor dielectric layer.

The method of forming a capacitor provided by the present invention uses a soft etching process to upgrade the accuracy when forming the bottom electrode layer. Accordingly, a capacitor structure of a memory device with higher reliability can therefore be obtained.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the presented invention, preferred embodiments will be described in detail. The preferred embodiments of the present invention are illustrated in the accompanying drawings with numbered elements.

Figure 1:
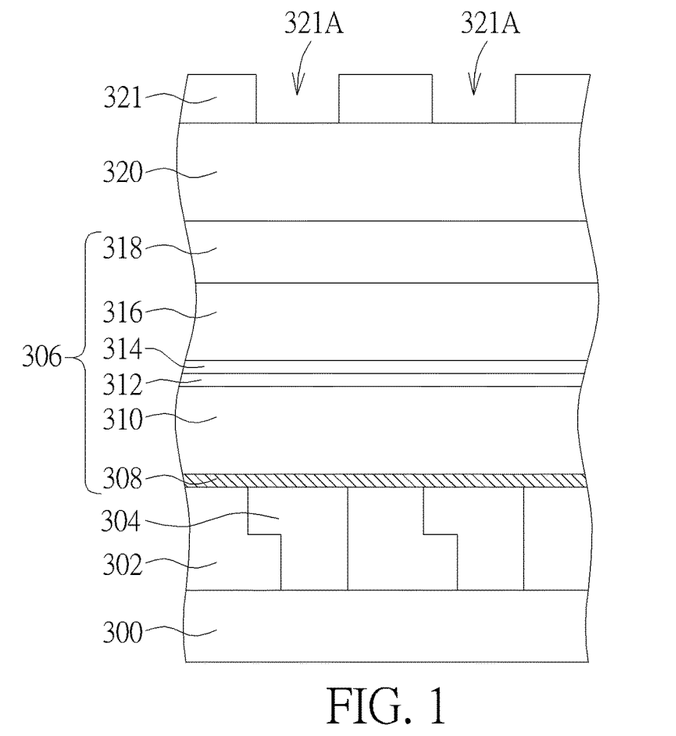
FIG. 1 to FIG. 10 are schematic diagrams showing the steps of forming a memory capacitor according to the present invention.

Please refer to FIG. 1 to FIG. 10, which are schematic diagrams showing the method of forming a memory capacitor according to one embodiment of the present invention. As shown in FIG. 1, a substrate 300 is provided. The substrate 300 may include a substrate having a semiconductor material, such as a silicon substrate, an epitaxial silicon substrate, a silicon germanium substrate, a silicon carbide substrate or a silicon-on-insulator (SOI) substrate. In one embodiment, the semiconductor substrate may have a plurality of electronic components such as access transistors (not shown) disposed thereon. In one embodiment, the access transistor can include a horizontal gate, a recess gate, or a vertical gate. Next, a dielectric layer 302 and a plurality of storage node contacts 304 (also called "landing pads") are formed on the substrate 300, wherein the storage node contacts 304 are individually connected to the source/drain region of the access transistor (not shown). Next, a supporting structure 306, a first mask layer 320, and a second patterned mask layer 321 are sequentially formed on the dielectric layer 302. In one embodiment, the supporting structure 306 includes, from bottom to top, a first supporting layer 308, a first filling layer 310, a second filling layer 312, a second supporting layer 314, a third filling layer 316 and a third supporting layer 318. The thickness of the first filling layer 310 and the third filling layer 316 are greater than the thickness of the second filling layer 312. The thickness of the third supporting layer 318 is greater than the thickness of the first supporting layer 308 and the second supporting layer 314. In one embodiment, the first filling layer 310 is made of boro-phospho-silicate-glass (BPSG), the second filling layer 310 and the third filling layer 316 include silicon oxide ($SiO_2$). The first supporting layer 308, the second supporting layer 314, and the third supporting layer 318 include silicon nitride (SiN).

The topmost portion of the supporting structure 306 (that is, the third supporting layer 318) has an etching selectivity with respect to the first mask layer 320 and the second patterned mask layer 321. In the present embodiment, the first mask layer 320 includes amorphous silicon, and second patterned mask layer 321 includes silicon oxide. The second patterned mask layer 321 has a plurality of openings 321A, each corresponds to the storage node contacts 304.

Figure 2:
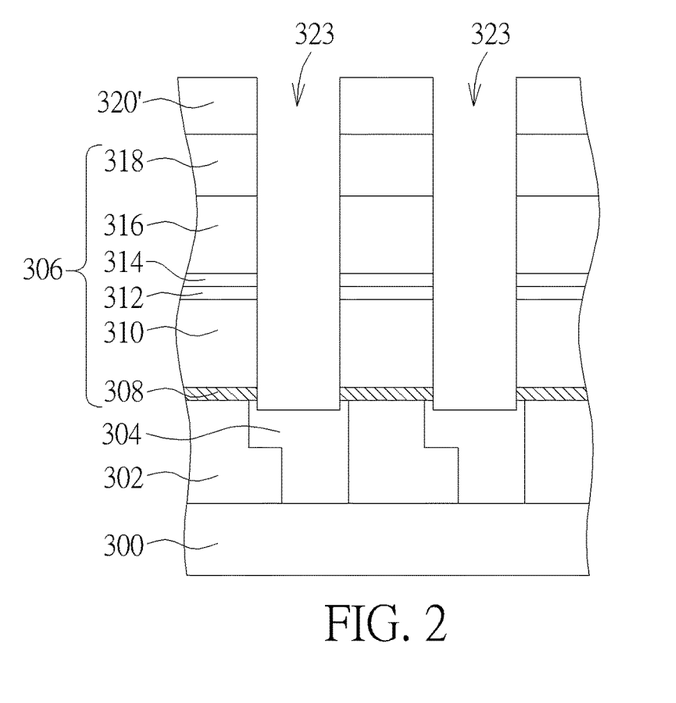

Next, as shown in FIG. 2, an etching process is performed by using the second patterned mask layer 321 as a mask to transfer the pattern of the second patterned mask layer 321 onto the first mask layer 320, thus forming a patterned first mask layer 320'. The second patterned mask layer 321 is removed. Then, by using the patterned first mask layer 320' as a mask, the supporting structure 306 is patterned to form a plurality of openings 323 therein, wherein each opening 323 corresponds to and exposes each storage node contact 304. The second patterned mask layer 321 is then removed.

Figure 3:
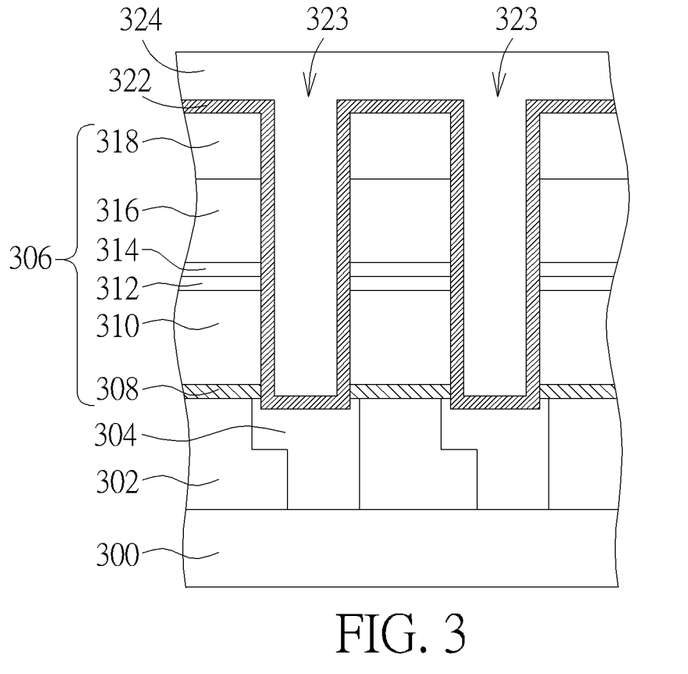

Next, as shown in FIG. 3, a bottom electrode layer 322 is formed on the substrate 300. The bottom electrode layer 322 is preferably formed conformally on the top surface of the third supporting layer 318, the sidewalls and the bottom surfaces of the opening 323, wherein the opening 323 is not completely filled with the bottom electrode layer 322. Then, a sacrificial layer 324 is formed on the bottom electrode layer 322 and completely fills up the opening 323. In one embodiment of the present invention, the bottom electrode layer 322 includes, for example, titanium nitride (TiN), and the sacrificial layer 324 includes, for example, silicon oxide, but they are not limited thereto.

Figure 4:
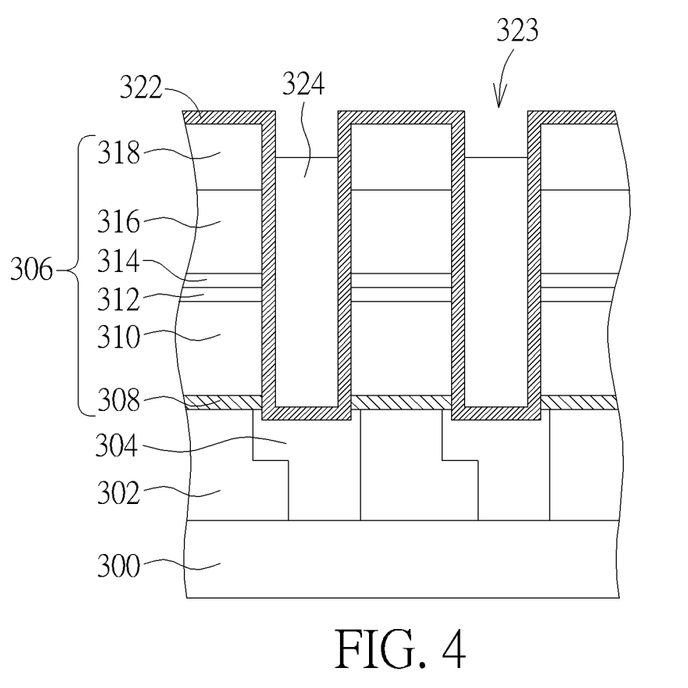

Next, as shown in FIG. 4, the sacrificial layer 324 is etched back until the top surface of the sacrificial layer 324 is lower than the top surface of the opening 323, that is, lower than the top surface of the third supporting layer 318. In one preferred embodiment, the top surface of the sacrificial layer 324 can still be higher than the bottom surface of the third supporting layer 318, that is, higher than the boundary between the third supporting layer 318 and the third filling layer 316. Therefore, the bottom electrode layer 322 on the top surface and partial sidewalls of the third supporting layer 318 will be exposed.

Figure 5:
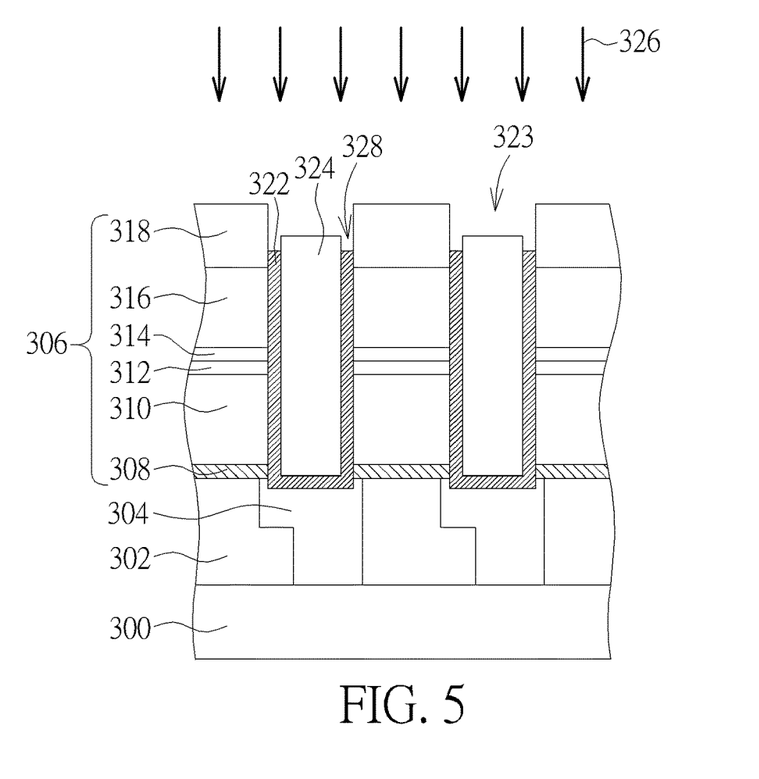

As shown in FIG. 5, a soft etching process 326 is then performed to remove the exposed bottom electrode layer 322. It is noted that the soft etching process in one preferred embodiment removes the exposed bottom electrode layer 322 until its top surface is lower than the top surface of the sacrificial layer 324, but is preferably still higher than the bottom surface of the third supporting layer 318, that is, being higher than the boundary between the third supporting layer 318 and the third filling layer 316. In the soft etching process of the present invention, since the bottom electrode layer 322 is to be etched below the sacrificial layer 324, the bottom electrode layer 322 is being etched in the recess 328 located between the third supporting layer 318, the sacrificial layer 324 and the bottom electrode layer 322. Because the recess 328 has vertical sidewalls, the top surface of the bottom electrode layer 322 can be removed uniformly without exhibiting inclined sides. The bottom electrode layer 322 can therefore have relatively horizontal top surface after the soft etching process. Accordingly, the bottom electrode layer 322 of the present invention will not comprise any sharp angle at its end portion, which is easy to cause corona discharge. The reliability of the memory device with this capacitor structure can be confirmed.

In one embodiment of the present invention, the soft etching process 326 is a dry etching process comprising using a fluorine containing compound, a nitrogen and hydrogen containing compound and an oxygen containing compound, in which the soft etching process is carried out under a temperature between 200 and 300 Celsius degrees, and preferably without using plasma. In one embodiment, the fluorine-containing compound includes fluorine gas ($F_2$), xenon difluoride ($XeF_2$) or nitrogen trifluoride ($NF_3$). The nitrogen-containing hydrogen-containing compound includes ammonia ($NH_3$), hydrazine ($N_2H_4$) or diazene ($N_2H_2$). The oxygen containing compound includes oxygen ($O_2$), ozone ($O_3$) or hydrogen oxide ($H_2O$). In another embodiment of the present invention, the soft etching process 326 is a wet etching process including using an etchant containing ammonium hydroxide/hydrogen peroxide/deionized water ($NH_4OH/H_2O_2/H_2O$), such as standard clean solution 1 (Standard clean, SC1), or containing sulfuric acid/hydrogen peroxide/deionized water ($HCl/H_2O_2/H_2O$), such as standard clean solution 2 (Standard clean, SC2). In conventional arts, when the etching gas has chlorine in combination of using plasma, it is easy for the bottom oxide layer 322 with titanium nitride (TiN) to generate a residue containing titanium tetrachloride ($TiCl_4$), which is extremely difficult to remove. However, since the soft etching process employed in the present invention does not contain chlorine, it is possible for the bottom electrode layer 322 to be free from etching residue. In the examples when using a fluorine-containing compound, a nitrogen-containing compound, and an oxygen-containing compound as an etching gas, a coordination compound $Ti(O_xN_yH_z)$ is generated after the etching process, and it is easy to remove the coordination compound by a simple washing process. On the other hand, the etching method with using the fluorine-containing compound, the nitrogen-containing compound, and the oxygen-containing compound can provide a good etching selectivity ratio for the bottom electrode layer 322 (TiN) and the third supporting layer 318 (SiN), so it only removes a small portion third supporting layer 318, preventing the situation that the crown electrode may collapse. In addition, when the soft etching process 326 is performed, the sacrificial layer 324 completely fills the opening 320 thereto protect the bottom electrode layer 322 located at the bottom of the opening 323 from being etched, and also increases the overall reliability of the bottom electrode layer 322.

Figure 6:
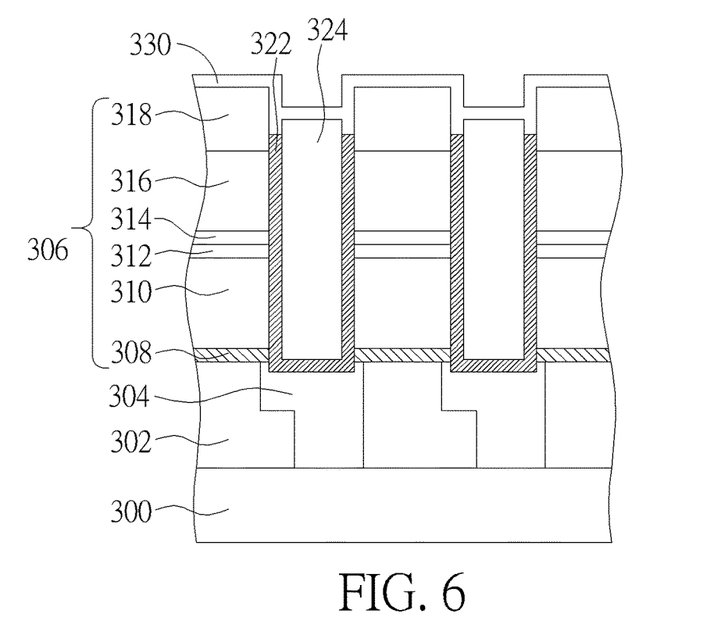

After performing the soft etching process 326, as shown in FIG. 6, a capping layer 330 is formed on the substrate 300, preferably conformally along the top surface and sidewalls of the third supporting layer 318, and on the sacrificial layer 324 and the bottom electrode layer 322. The material of the capping layer 330 is, for example, tetraethoxysilane (TEOS).

Figure 7:
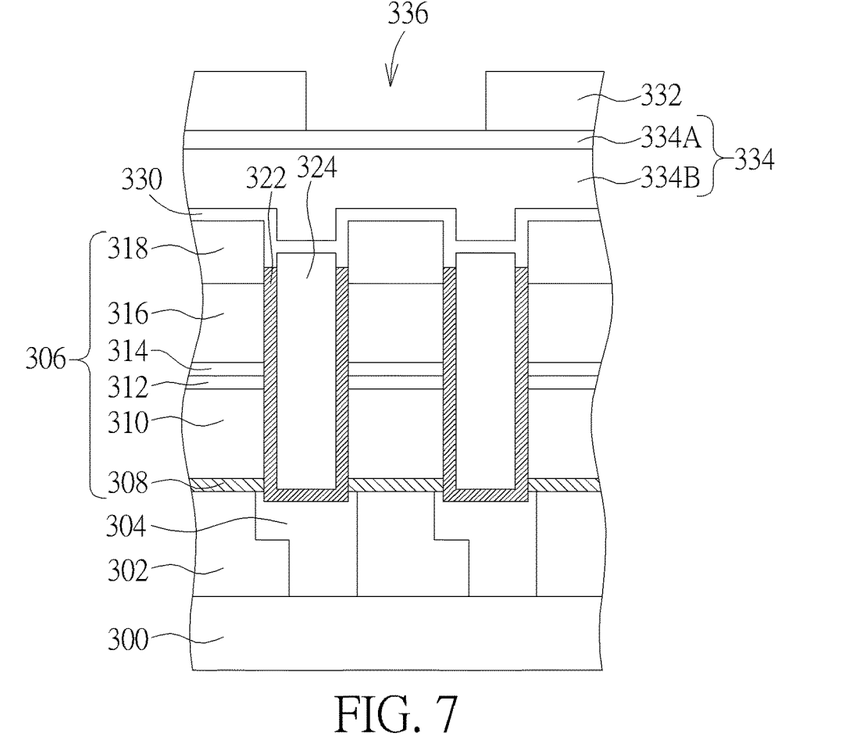

Next, as shown in FIG. 7, a patterned layer 332 and a mask layer 334 are formed on the capping layer 330. The patterned layer 332 includes at least one opening 336, which is disposed between the two openings 323, and more preferably, the sidewalls of the opening 336 are vertically aligned with the centrals of the openings 323. In one embodiment, the patterned layer 332 and the mask layer 334 can be selected according to different process requirement. For example, the patterned layer 332 can include photoresist material that can be decomposed by a light source with a wavelength of 193 nanometers, wherein a bottom anti-reflection coating (BARC) can be selectively disposed under the patterned layer 332. The mask layer 334 can include any material that is suitable as a hard mask layer, which can include one or more than one mask material, in which the mask layer may be silicon nitride (SiN), silicon oxynitride (SiON), silicon carbide (SiC) or silicon-containing organic material such as the advanced pattern film (APF) provided by the Applied Materials, Inc. In one preferred embodiment, the mask layer 334 can include a silicon-containing hardmask bottom anti-reflection coating (SHB) 334A provided by Shin-Etsu Chemical Co. Ltd. and an organic dielectric layer (OLD) 334B, wherein the SHB layer 334A directly contacts the patterned layer 332 containing photoresist material, serving as a BARC layer or a mask layer, and the OLD layer 334B serves as the final mask layer.

Figure 8:
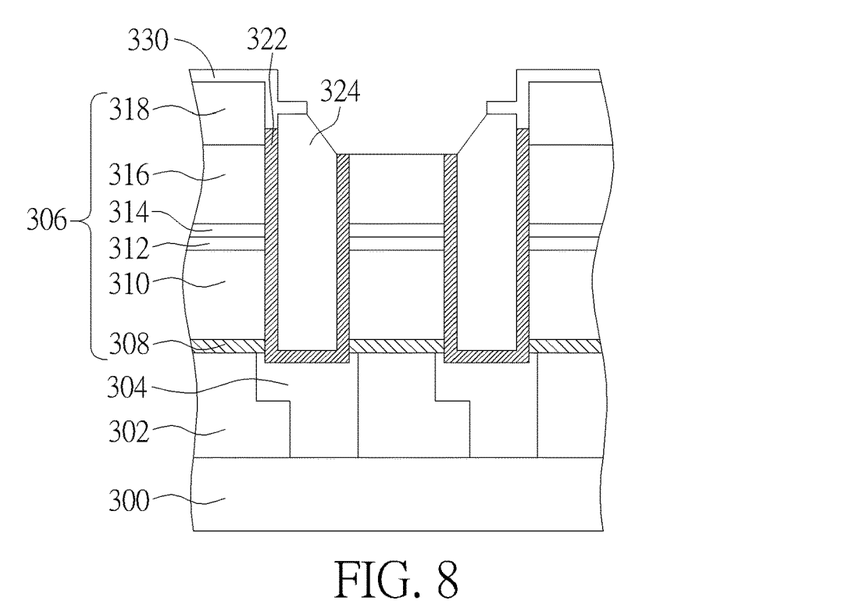

Next, as shown in FIG. 8, an etching process is performed to transfer the pattern of the patterned layer 332 onto the mask layer 334. The patterned layer 332 is then removed. Subsequently, the pattern of the mask layer 334 is transferred to the above layers, including the third supporting layer 318 between the two openings 323, the capping layer 330 between the two openings 323, a part of the sacrificial layer 324 and a part of the bottom electrode layer 322. Next, the mask layer 334 is removed.

Figure 9:
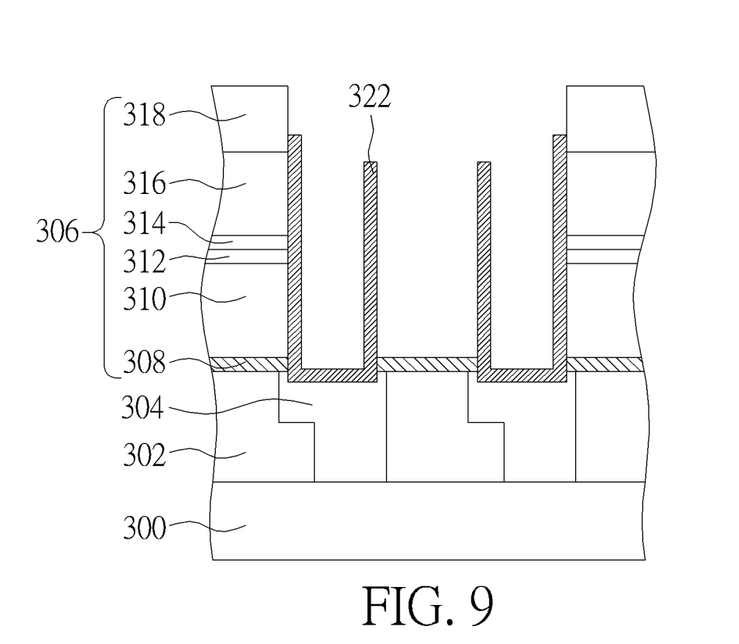

As shown in FIG. 9, the capping layer 330, the sacrificial layer 324 and the first filling layer 310, the second filling layer 312 and the third filling layer 316 are completely removed with retaining the bottom electrode layer 324, the first supporting layer 308, the second supporting layer 314 and the third supporting layer 318, wherein the bottom electrode layer 324 is supported by the first supporting layer 308, the second supporting layer 314 and the third supporting layer 318. In one embodiment of the present invention, the removing steps can be performed separately, for example, completely removing the capping layer 330, the sacrificial layer 324 and the second filling layer 310 by a wet etching process, following by removing the second supporting layer 314 between the two openings 323, then removing the first filling layer 310.

Figure 10:
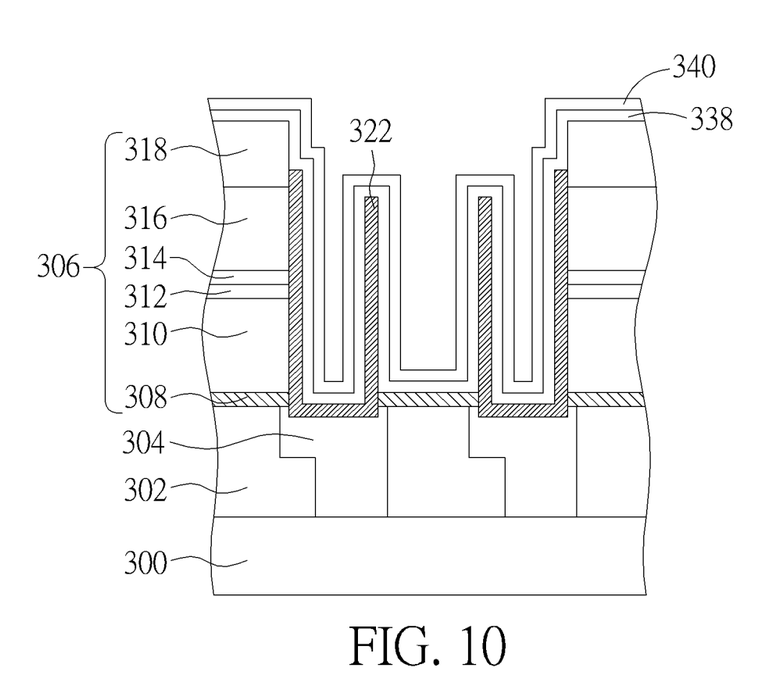

Lastly, as shown in FIG. 10, a capacitor dielectric layer 338 and a top electrode layer 340 are formed sequentially for covering the bottom electrode layer 324. The capacitor dielectric layer 338 may include $SiO_2$ or high-k dielectric material. High-k dielectric material includes metal oxide, preferably rare earth metal oxide, such as hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), lanthanum aluminum oxide (LaAlO), tantalum oxide ($Ta_2O_5$), zirconium oxide ($ZrO_2$), zirconium silicon oxide ($ZrSiO_4$), hafnium zirconium oxide (HfZrO), strontium bismuth tantalate ($SrBi_2Ta_2O_9$, SBT), lead zirconate titanate ($PbZr_xTi_{1-x}O_3$, PZT) or barium strontium titanate ($Ba_xSr_{1-x}TiO_3$, BST), but is not limited thereto. The top electrode layer 340 includes gold (Au), silver (Ag), copper (Cu), aluminum (Al), molybdenum (Mo), titanium (Ti), tantalum (Ta), cadmium (Cd), a nitride compound thereof, an oxide compound thereof, or an alloy thereof, or a combination thereof. By using the above method, the capacitor structure of the memory device can therefore be obtained, including the bottom electrode layer 324, the dielectric layer 338 and the top electrode layer 340.

In summary, the present invention therefore discloses a method of forming a capacitor structure of a memory device. The method includes a soft etching process so as to upgrade the accuracy of forming the bottom electrode layer, thus achieving a capacitor structure with higher reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a memory capacitor, comprising:
   providing a substrate, which comprises a plurality of storage node contacts;
   forming a patterned supporting structure on the substrate, wherein the patterned supporting structure comprises a plurality of openings, each of which corresponding to each of the storage node contacts;
   forming a bottom electrode layer on the patterned supporting layer, wherein the bottom electrode layer is conformally formed on the patterned supporting layer and sidewalls and bottom surfaces of the openings, and contacting the storage node contacts;
   forming a sacrificial layer on the bottom electrode layer, wherein the sacrificial layer is filled into the openings, wherein before the soft etching process, a bottom surface of the sacrificial layer is lower than a top surface of the patterned supporting layer;
   performing a soft etching process for removing the bottom electrode layer on the patterned supporting layer and partials of sidewalls of the openings, wherein said soft etching process comprises using a fluoride containing compound, a nitrogen and hydrogen containing compound and an oxygen containing compound;
   completely removing the sacrificial layer;
   removing partials of the patterned supporting layer;
   forming a capacitor dielectric layer on the bottom electrode layer; and
   forming a top electrode layer on the capacitor dielectric layer.

2. The method of forming a memory capacitor according to claim 1, wherein the fluoride containing compound comprises fluorine ($F_2$), xenon difluoride ($XeF_2$) or nitrogen trifluoride ($NF_3$).

3. The method of forming a memory capacitor according to claim 1, wherein the nitrogen and hydrogen containing compound comprises ammonia ($NH_3$), hydrazine ($N_2H_4$) or diazene ($N_2H_2$).

4. The method of forming a memory capacitor according to claim 1, wherein the oxygen containing compound comprises oxygen ($O_2$), ozone ($O_3$) or hydrogen oxide ($H_2O$).

5. A method of forming a memory capacitor, comprising:
   providing a substrate, which comprises a plurality of storage node contacts;
   forming a patterned supporting structure on the substrate, wherein the patterned supporting structure comprises a plurality of openings, each of which corresponding to each of the storage node contacts;
   forming a bottom electrode layer on the patterned supporting layer, wherein the bottom electrode is conformally formed on the patterned supporting layer and sidewalls and bottom surfaces of the openings, and contacting the storage node contacts;

forming a sacrificial layer on the bottom electrode layer, wherein the sacrificial layer is filled into the openings;

performing a soft etching process for removing the bottom electrode on the patterned supporting layer and partials of sidewalls of the openings, thereby making atop surface of the bottom electrode layer lower than a top surface of the sacrificial layer and forming a plurality of recesses between the patterned support layer, the sacrificial layer and the bottom electrode;

completely removing the sacrificial layer;

removing partials of the patterned supporting layer;

forming a capacitor dielectric layer on the bottom electrode layer; and forming a top electrode on the capacitor dielectric layer.

6. The method of forming a memory capacitor according to claim 5, wherein before the soft etching process, a bottom surface of the sacrificial layer is lower than a top surface of the patterned supporting layer.

7. The method of forming a memory capacitor according to claim 5, wherein the patterned supporting structure from bottom to top sequentially comprises a first supporting layer, a first filling layer, a second filling layer, a second supporting layer, a third filling layer and a third supporting layer, wherein after the soft etching process, the top surface of the bottom electrode layer is higher than a boundary between third supporting layer and the third filling layer.

8. The method of forming a memory capacitor according to claim 7, wherein the step of removing the patterned supporting structure is to remove the first filling layer, the second filling layer and the third filling layer.

9. The method of forming a memory capacitor according to claim 5, wherein the top surface of the bottom electrode layer is substantially parallel to a horizontal direction.

* * * * *